United States Patent
Ilicali et al.

(10) Patent No.: US 7,312,126 B2
(45) Date of Patent: Dec. 25, 2007

(54) PROCESS FOR PRODUCING A LAYER ARRANGEMENT, AND LAYER ARRANGEMENT FOR USE AS A DUAL GATE FIELD-EFFECT TRANSISTOR

(75) Inventors: Gurkan Ilicali, Munich (DE); Richard Johannes Luyken, Munich (DE); Wolfgang Roesner, Ottobrunn (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 11/178,251

(22) Filed: Jul. 8, 2005

(65) Prior Publication Data
US 2006/0027881 A1 Feb. 9, 2006

(30) Foreign Application Priority Data
Jul. 8, 2004 (DE) .................... 10 2004 033 148

(51) Int. Cl.
*H01L 21/336* (2006.01)
(52) U.S. Cl. ............... 438/283; 257/E21.623
(58) Field of Classification Search ........ 438/244, 438/268, 283
See application file for complete search history.

(56) References Cited

U.S. PATENT DOCUMENTS

2006/0022264 A1* 2/2006 Mathew et al. ............. 257/331

FOREIGN PATENT DOCUMENTS

| DE | 102 23 719 C1 | 11/2003 |
| DE | 102 23 709 A1 | 12/2003 |

OTHER PUBLICATIONS

"Silicon Wafer Bonding Technology for VSLI and MEMS applications"; Iyer, SS, Auberton-Herve, AJ (eds.), Inspec IEE, 2002.
Tserept, A., et al.; "Dry etching of porous silicon in high density plasmas"; phys.stat.sol. (a) 197, No. 1, pp. 163-167 (2003).
Lehmann, Volker; "Electrochemistry of Silicon", Chapter 6, Wiley-VCH- Verlag, 2002.

* cited by examiner

Primary Examiner—Scott B. Geyer
Assistant Examiner—Elias Ullah
(74) Attorney, Agent, or Firm—Dickstein, Shapiro, LLP.

(57) ABSTRACT

The invention relates to a process for producing a layer arrangement, in which, a porous silicon layer is formed as sacrificial layer on an auxiliary substrate, a first semiconductor layer is formed on the sacrificial layer, a first electrically insulating layer is formed on the first semiconductor layer, an electrically conductive layer is formed on the first electrically insulating layer, which electrically conductive layer is laterally patterned, the first electrically insulating layer, the sacrificial layer and the first semiconductor layer are jointly laterally patterned using the laterally patterned electrically conductive layer as a mask, a semiconductor structure is formed adjacent to side walls of the patterned sacrificial layer and of the patterned first semiconductor layer, a substrate is secured over the patterned electrically conductive layer, material of the auxiliary substrate is removed, so that the sacrificial layer is uncovered, the sacrificial layer is selectively removed, so as to form a trench, and a second electrically insulating layer is formed in the trench, then an electrically conductive structure is formed on this second electrically insulating layer.

18 Claims, 9 Drawing Sheets

FIG 9

PROCESS FOR PRODUCING A LAYER ARRANGEMENT, AND LAYER ARRANGEMENT FOR USE AS A DUAL GATE FIELD-EFFECT TRANSISTOR

CROSS-REFERENCE TO RELATED APPLICATION

This application claims priority to German Patent Application Serial No. 10 2004 033 148.0 filed Jul. 8, 2004.

FIELD OF THE INVENTION

The invention relates to a process for producing a layer arrangement and to a layer arrangement for use as dual gate field-effect transistor.

BACKGROUND OF THE INVENTION

Modern semiconductor technology is pursuing new approaches for improving the performance of field-effect transistors. These approaches consist not only in continued scaling and miniaturization of the field-effect transistors, but also in the development of new types of transistors.

These new types of transistors include, for example, fin field-effect transistors, in which the channel region between two source/drain regions is realized in a semiconductor fin, above which a gate region is deposited.

Another new type of transistor is what is known as the dual gate transistor. In a dual gate field-effect transistor, unlike in conventional field-effect transistors, the channel region is driven not just from one side, but rather, in a sandwich design, a thin channel region is driven from both sides, i.e. for example from above and below, by means of a gate electrode in each case, so that the electrical conductivity of the channel region can be particularly well controlled. However, the dual gate transistor technology imposes high demands on the process engineering used.

One of the main problems in the production of a planar dual gate field-effect transistor is the orientation of the top gate electrode and of the bottom gate electrode with respect to one another. With electron beam lithography, the two gate regions can be aligned with an accuracy of at best 10 nm with respect to one another. In other words, the process engineering used results in a lateral offset between the two gate electrodes of at least 10 nm. However, dual gate field-effect transistors are of interest in particular for feature sizes in the range from typically 20 nm to 10 nm. Therefore, accurate alignment of top gate and bottom gate relative to one another is very important for the functioning of a dual gate field-effect transistor.

Another obstacle to the production of planar dual gate MOS field-effect transistors is the highly complex production steps and the expensive installations which are required for the production of a dual gate field-effect transistor.

One way of producing dual gate field-effect transistors in accordance with the prior art consists in using what is known as an SOI (silicon-on-insulator) substrate, i.e. a substrate in which a silicon oxide layer is formed on a silicon bulk wafer, and a thin top silicon layer is formed on the silicon oxide layer. The top silicon layer is very thin and can be used as the channel region of a dual gate field-effect transistor, since a channel region of this type should be sufficiently thin to allow it to be driven successfully from both sides.

To summarize, processes for the production of layer arrangements which can be used as dual gate field-effect transistor arrangements which are known from the prior art are very expensive and complex to realize. This applies in particular to dual gate field-effect transistors produced using SOI technology.

"Silicon Wafer Bonding Technology for VLSI and MEMS applications", Iyer, S S, Auberton-Herve, A J (eds.), Inspect IEE, 2002, discloses fundamental principles of silicon wafer bonding technology.

Tserepi, A, Tamis, C, Gogolides, E, Nassipoulou, A G, (2003) PhysStatSol A 197, 163, discloses a process for etching porous silicon.

Lehmann, Volker, "Electrochemistry of Silicon", chapter 6, Wiley-VCH-Verlag, 2002, discloses a process for forming porous silicon.

DE 102 23 719 C1 discloses a layer arrangement, a process for producing a layer arrangement and a silicon-on-insulator wafer arrangement. The layer arrangement includes a first substrate having a first main surface, which includes a first delamination layer that can be removed by means of heat treatment. Furthermore, the layer arrangement has a second substrate with a second main surface, which includes a temperature-stable, second removable delamination layer. The first main surface of the first substrate is secured to the second main surface of the second substrate.

DE 102 23 709 A1 discloses a process for producing a dual gate field-effect transistor. The process includes the following steps: forming a first gate region on a silicon-on-insulator substrate of a first wafer, forming a layer with a planar surface over the silicon-on-insulator substrate and the first gate region, bonding a second wafer onto the planar surface of the first wafer and forming a second gate region, opposite the first gate region, in the silicon-on-insulator substrate.

SUMMARY OF THE INVENTION

A process for producing a layer arrangement. A porous silicon layer is formed as a sacrificial layer on an auxiliary substrate. A first semiconductor layer is formed on the sacrificial layer. A first electrically insulating layer is formed on the first semiconductor layer. An electrically conductive layer is formed on the first electrically insulating layer, wherein the electrically conductive layer is laterally patterned. The first electrically insulating layer, the sacrificial layer, and the first semiconductor layer are jointly patterned laterally using the laterally patterned electrically conductive layer as a mask. A semiconductor structure is formed adjacent to side walls of the patterned sacrificial layer and of the patterned first semiconductor layer. A substrate is secured over the patterned electrically conductive layer. Material of the auxiliary substrate is removed, so that the sacrificial layer is uncovered. The sacrificial layer is selectively removed so as to form a trench. A second electrically insulating layer is formed in the trench, and an electrically conductive structure is formed on this second electrically insulating layer.

BRIEF DESCRIPTION OF THE DRAWINGS

Exemplary embodiments of the invention are illustrated in the figures and explained in more detail in the text which follows. In the drawings.

Identical or similar components are denoted by the same reference designations in different figures.

The illustrations presented in the figures are diagrammatic and not to scale.

DETAILED DESCRIPTION OF PREFERRED EMBODIMENTS OF THE INVENTION

The invention is based in particular on the problem of providing a layer arrangement which allows the realization of a dual gate field-effect transistor with gate regions that are aligned with respect to one another and can be produced at acceptable outlay.

This problem is solved by a process for producing a layer arrangement and by a layer arrangement.

In the process according to the invention for producing a layer arrangement, a porous silicon layer is formed as sacrificial layer on an auxiliary substrate, and a first semiconductor layer is formed on the sacrificial layer. A first electrically insulating layer is formed on the first semiconductor layer. An electrically conductive layer is formed on the first electrically insulating layer. The electrically conductive layer is laterally patterned. The first electrically insulating layer, the sacrificial layer and the first semiconductor layer are jointly laterally patterned using the laterally patterned electrically conductive layer as a mask. A semiconductor structure is formed adjacent to side walls of the patterned sacrificial layer and of the patterned first semiconductor layer. A substrate is secured over the patterned electrically conductive layer. Material of the auxiliary substrate is removed, so that the sacrificial layer is uncovered. The sacrificial layer is selectively removed, resulting in the formation of a trench. A second electrically insulating layer is formed in the trench, and an electrically conductive structure is formed on this second electrically insulating layer.

The layer arrangement according to the invention includes an auxiliary substrate, a porous silicon layer as sacrificial layer on the auxiliary substrate, a first semiconductor layer on the sacrificial layer, a first electrically insulating layer on the first semiconductor layer, and an electrically conductive layer on the first electrically insulating layer. The electrically conductive layer is laterally patterned. The first electrically insulating layer, the sacrificial layer and the first semiconductor layer are jointly laterally patterned using the laterally patterned electrically conductive layer as a mask. Furthermore, the layer arrangement includes a semiconductor structure adjacent to side walls of the patterned sacrificial layer and of the patterned first semiconductor layer, and includes a substrate which is secured over the patterned electrically conductive layer.

A basic concept of the invention is based on forming a patterned first semiconductor layer, as a thin channel region, and a semiconductor structure, which is laterally adjacent to the first semiconductor layer on both sides and extends deep into the layer arrangement, as source/drain regions, on any desired auxiliary substrate (which may, for example, be a conventional and therefore inexpensive bulk silicon wafer, which means that it is not necessarily a requirement that an expensive SOI substrate be used). Electrically conductive material which has been deposited and patterned can be designed as a gate region and also used as a mask for patterning a sacrificial layer. After a wafer bonding step, in which a substrate is secured to the surface of the processed structure, the auxiliary substrate is partially removed, making it possible to process the layer arrangement from the rear side. One main aspect of the invention in this context is based on the patterned porous silicon sacrificial layer which has been uncovered by means of the wafer bonding being removed selectively with respect to the semiconductor structure, so that the channel region is uncovered on the rear side, thereby allowing the layer sequence to be processed from the rear side, so that a second gate electrode, which drives the other side of the channel region and is in a predetermined orientation with respect to the first gate electrode can also be formed. The joint patterning of electrically conductive layer and porous silicon sacrificial layer results in the two gate regions being oriented self-aligned with respect to one another.

The sacrificial layer used is a porous silicon layer. This has the advantage that the sacrificial layer, with this selection of material, can be removed with a particularly high selectivity with respect to adjoining layers, in particular with respect to crystalline silicon layers.

The process described in Lehmann et al. is preferably used to form the porous silicon layer. Lehmann et al. discloses a process for producing porous silicon.

The term porous silicon is to be understood in particular as meaning silicon which has been formed on the basis of crystalline silicon into which pores or small cavities have been introduced. These pores may, for example, have dimensions in the nanometer range. Pores of this type can be formed in the silicon when a bulk silicon structure is brought into contact with a suitable etching solution, resulting in the formation of porous silicon.

By using porous silicon as a sacrificial structure with an important function in the production of the layer arrangement according to the invention, deliberate use is made of the materials properties of this material in order to form a layer arrangement which can be used as a dual gate field-effect transistor. These properties consist in particular in the fact that porous silicon can be etched with a high selectivity with respect to crystalline semiconductor material (in particular with respect to single-crystal silicon) and that crystalline semiconductor material (in particular single-crystal silicon) can be grown on porous silicon in a high quality. Furthermore, the etching selectivity of porous silicon with respect to electrically insulating materials such as silicon nitride is likewise high.

Therefore, the invention combines a suitable procedure using standard process steps in semiconductor technology with the possibility of using a favorable substrate and an advantageous material for the sacrificial layer, it being possible for the layer arrangement obtained to be used as a dual gate field-effect transistor with two gate regions that are self-aligned with respect to one another. In particular, because of the patterning steps, on account of which the electrically conductive layer, the first electrically insulating layer, the sacrificial layer and the first semiconductor layer form a substantially joint lateral interface, a self-aligning process is created, with the result that the two laterally delimited layers (electrically conductive layer and electrically conductive structure) which can be used as gate regions are formed self-aligned with respect to one another.

In other words, the invention allows a self-aligned procedure using simple standard production steps in which an inexpensive silicon bulk wafer can be used instead of an SOI wafer to form a layer arrangement which is suitable for operation as a dual gate field-effect transistor, which means that the cost and outlay involved in the process are kept at a low level.

One important aspect of the invention is that of providing a sacrificial layer of a material which is such (in particular porous silicon) that selective etching of the sacrificial layer with respect to the material of the semiconductor structure is possible. By way of example, the sacrificial layer of porous silicon may be arranged on an additional semiconductor layer. By way of example, $p^{++}$-doped silicon, which can be used as an etching stop layer, e.g. in alkaline solution (in a similar way to a buried silicon oxide of an SOI wafer), is a suitable material for an additional semiconductor layer of this type.

The process according to the invention includes a process step in which the auxiliary substrate and the substrate are secured to one another, which can be achieved by means of wafer bonding at room temperature. This procedure then enables the two gate regions above and below the first semiconductor layer, which serves as channel region and may be formed, for example, from crystalline silicon, to be aligned automatically with respect to one another. The selectively removable sacrificial layer, which is formed from porous silicon, which porous silicon is used in such a way that the self-alignment is effected by means of the selective etching of the materials used, plays an important role for the self-aligned orientation of the two gate regions with respect to one another.

The process created does not require any exotic or new materials, but rather uses standard materials which a well known from semiconductor technology and also uses standard process steps of conventional semiconductor technology which are adapted for front end processing and can therefore be realized with little outlay in many laboratories and factories.

In other words, the invention provides a self-aligned planar dual gate field-effect transistor which, starting from a bulk wafer (instead of an SOI wafer) can be processed, for example, from a semiconductor material such as silicon or from quartz. Of course, the invention can also be implemented on the basis of an SOI wafer. The process provided draws benefits from a high etching selectivity of porous silicon compared to bulk silicon. Another benefit is the recognized ability, which has been exploited according to the invention, to grow silicon single crystals of good quality on a porous silicon layer of this type.

The process sequence created not only eliminates the need for an SOI substrate to form a dual gate field-effect transistor, so that a planar dual gate field-effect transistor can be created at low cost, but also, using simple standard production steps, allows the realization of completely self-aligned top gates and bottom gates.

Preferred refinements of the invention will emerge from the dependent claims.

The auxiliary substrate used may be a bulk substrate (for example formed from a semiconductor material or from quartz material). The auxiliary substrate used may in particular be a silicon bulk wafer. The porous silicon layer used may be a silicon layer with a first porosity and a silicon layer with a second porosity arranged thereon, the first porosity being higher or greater than the second porosity. Porous silicon may have different porosities. Porous silicon with a high porosity has a high proportion of pores (pore volume) with respect to surrounding silicon material (silicon volume) and may in particular have a greater pore length and/or a greater pore diameter than porous silicon with a lower porosity. Porous silicon with a low porosity has a low proportion of pores with respect to surrounding silicon material and may in particular have a smaller pore length and/or a smaller pore diameter than porous silicon with a relatively high porosity.

The first semiconductor layer used may be a single-crystal silicon layer.

The electrically conductive layer used may be a polycrystalline silicon layer. As a result, a layer of sufficiently good conductivity which can be used as a first gate region of a dual gate field-effect transistor is provided using pure silicon technology.

The semiconductor structure used may be single-crystal silicon material. The selective removal of the sacrificial layer can be realized by means of an etching process, by means of which the material of the sacrificial layer is removed selectively with respect to material of the semiconductor structure.

A second semiconductor layer can be formed between the auxiliary substrate and the sacrificial layer. The second semiconductor layer may in particular include a p-doped silicon layer and an n-doped silicon layer arranged thereon. The dopant concentration of the p-doped silicon layer is preferably greater (e.g. $p^{++}$-silicon) than the dopant concentration of the n-doped silicon layer (e.g. $n^+$-silicon).

The second semiconductor layer can be used for example as an etch stop layer during the process.

Alternatively, the second semiconductor layer may also include a germanium-silicon layer and an n-doped silicon layer arranged thereon.

Prior to the securing of the substrate, an electrically insulating structure with a planar surface may be formed on the layer sequence comprising the processed auxiliary substrate. An electrically insulating layer, which is preferably formed from the same material as the electrically insulating structure, allowing particularly successful bonding, is likewise provided at the surface of the substrate.

The substrate can be secured by means of bonding.

A metallic material, for example for forming a metal-semiconductor contact, may be applied to the (uncovered)

semiconductor structure and/or to the (uncovered) electrically conductive structure and/or to the (uncovered) laterally patterned electrically conductive layer. If the semiconductor structure and/or the electrically conductive structure includes silicon material, siliciding is effected by the application of metallic material. Siliciding, i.e. the formation of a metal-semiconductor compound, results in a low contact resistance for the semiconductor structure which can be used as source/drain regions and/or for the electrically conductive structure which can be used as gate electrode.

It is preferable for the layer arrangement to be designed or connected or fitted up as a dual gate field-effect transistor.

In particular, the first semiconductor layer may be designed as a channel region, the semiconductor structure may be designed as first and second source/drain regions, the electrically conductive layer may be designed as a first gate electrode, the first electrically insulating layer may be designed as a first gate-insulating layer, the electrically conductive structure may be designed as a second gate electrode and the second electrically insulating layer may be designed as a second gate-insulating layer.

Figure 1:
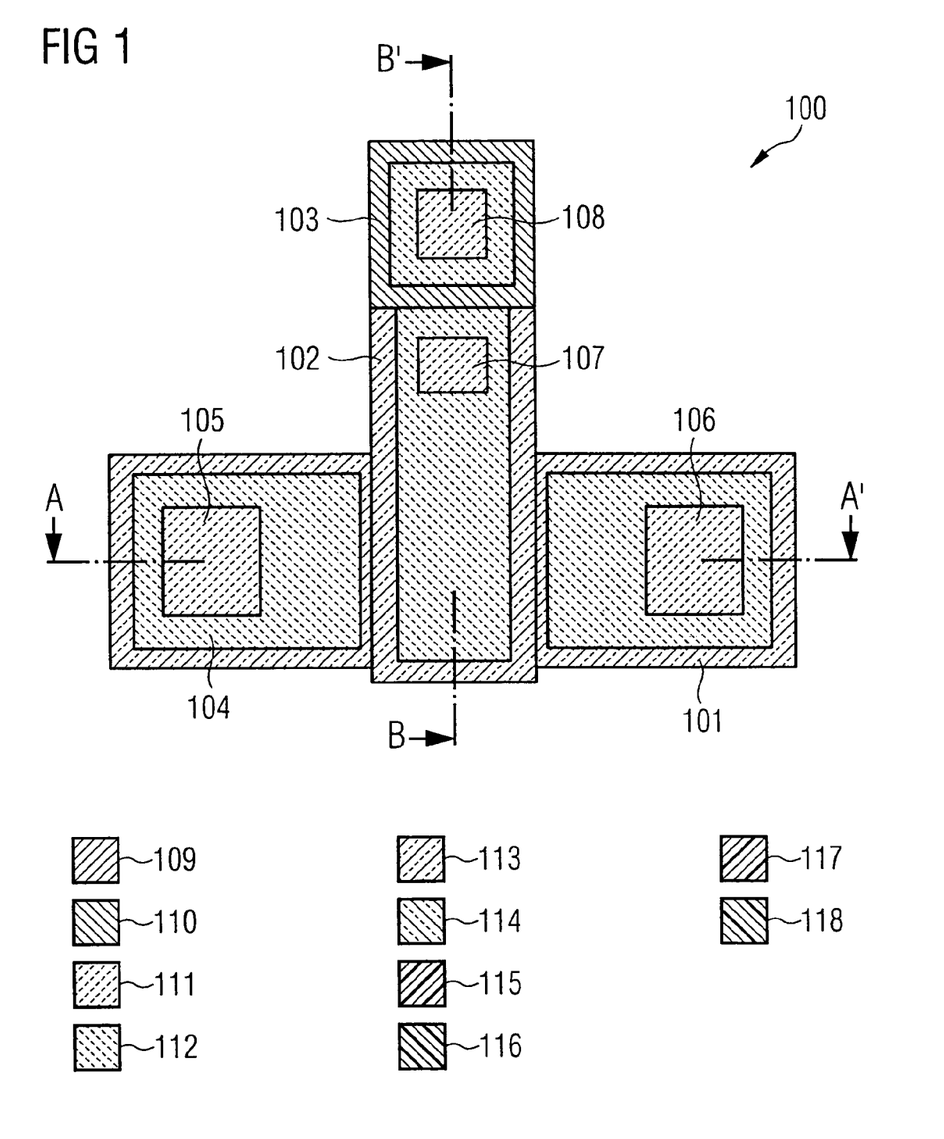
FIG. 1 shows a layout plan view of a dual gate field-effect transistor in accordance with a first exemplary embodiment of the invention.
Figure 7:
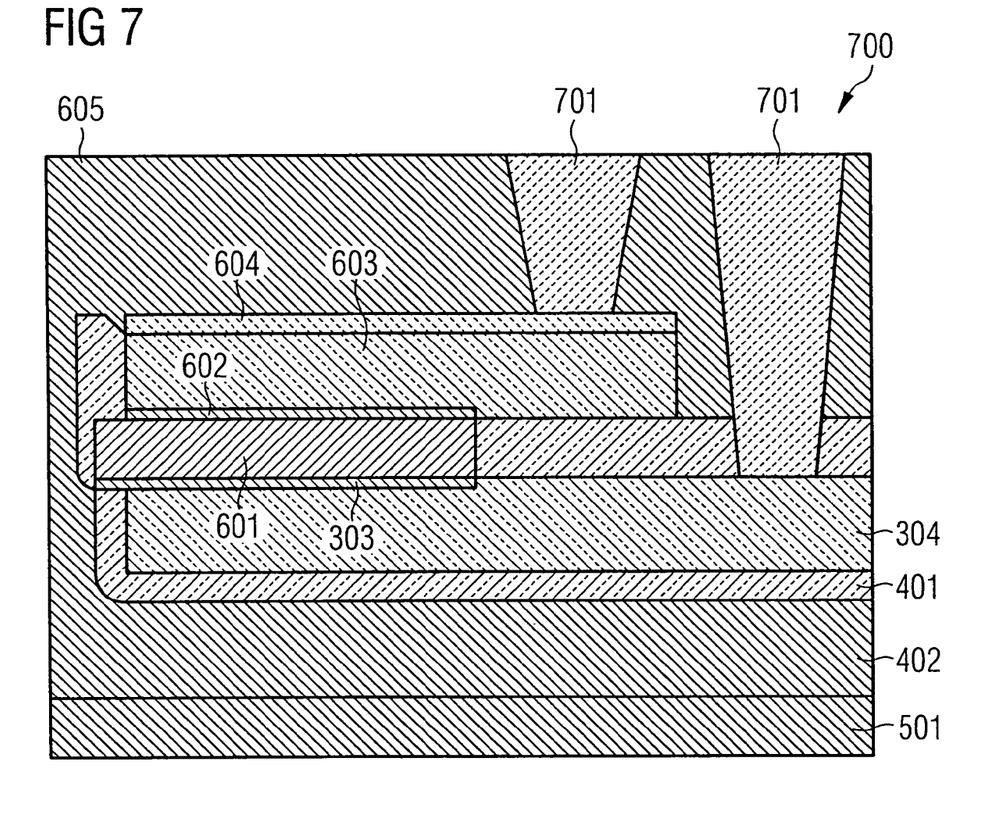
FIG. 7 shows a cross-sectional view through the dual gate field-effect transistor in accordance with the first exemplary embodiment of the invention on a section line B-B' from FIG. 1.
Figure 8:
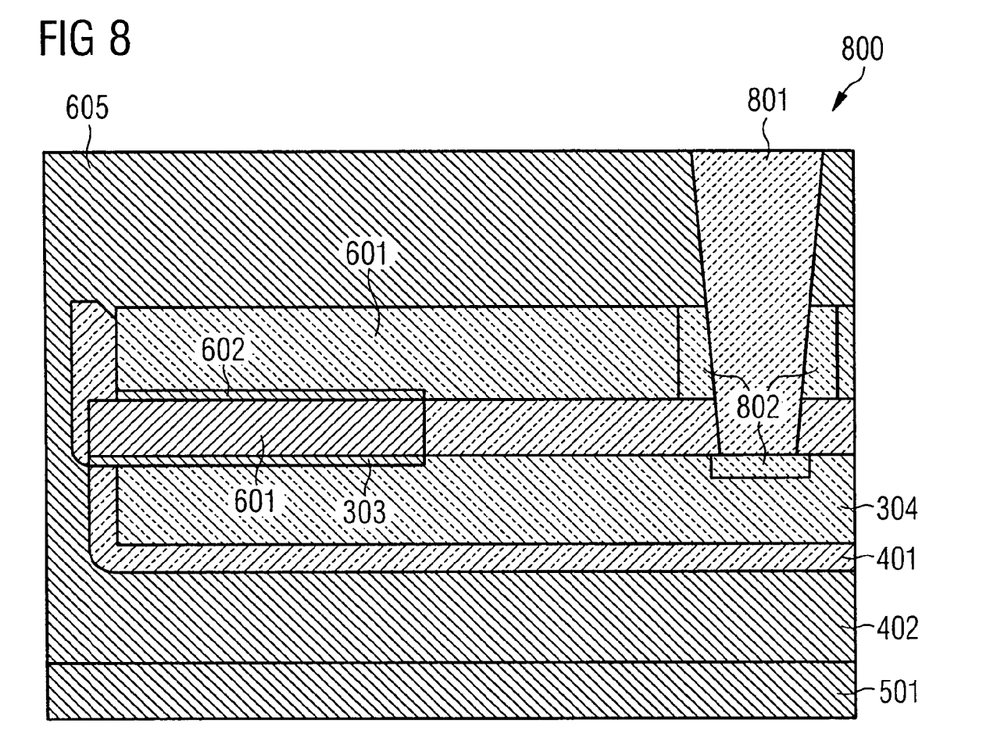
FIG. 8 shows a cross-sectional view through a dual gate field-effect transistor in accordance with a second exemplary embodiment of the invention on a section line B-B' from FIG. 1.

The layout plan view shown in FIG. 1 illustrates the overall device layout of a dual gate field-effect transistor which has been produced using the production process according to the invention. FIG. 2 to FIG. 6 show cross-sectional views on a section line A-A' from FIG. 1 through layer sequences between individual process steps of the process for producing the dual gate field-effect transistor in accordance with the first exemplary embodiment of the invention. FIG. 7 shows a cross-sectional view on a section line B-B' from FIG. 1. FIG. 8 shows a cross-sectional view on a section line A-A' from FIG. 1 and shows an alternative realization of contact-connection elements for the contact-connection of gate regions to the configuration shown in FIG. 7.

The text which follows, referring to FIG. 1, describes a layout plan view of a dual gate field-effect transistor 100 in accordance with a first exemplary embodiment of the invention.

An active region 101, which is defined by means of a first photolithography step, of the dual gate field-effect transistor 100 is shown. This active region includes a channel region (not shown in FIG. 1) between a first source/drain region 105 and a second source/drain region 106.

Furthermore, FIG. 1 shows a gate-defining region 102 which is defined by means of a second photolithography process.

A third photolithography process defines a bottom gate contact hole-defining region 103, by means of which a contact hole of the bottom gate region 108 is defined.

The other contact holes are defined by means of a fourth photolithography process, i.e. an additional contact hole-defining region 104 is delimited.

FIG. 1 shows a top gate region 107 and a bottom gate region 108 of the dual gate field-effect transistor 100.

FIG. 1 also diagrammatically depicts the materials used to produce the dual gate field-effect transistor 100. Monocrystalline silicon (single-crystal, c-silicon) is denoted by reference numeral 109, silicon oxide ($SiO_2$) is denoted by reference numeral 110, metal material is denoted by reference numeral 111, silicide (a silicon-metal compound) is denoted by reference numeral 112, silicon nitride ($Si_3N_4$) is denoted by reference numeral 113, polysilicon (polycrystalline silicon) is denoted by reference numeral 114, high-porosity silicon (i.e. silicon with a high degree of porosity) is denoted by reference numeral 115, low-porosity silicon (i.e. silicon with a lower degree of porosity) is denoted by reference numeral 116, $p^{++}$-silicon is denoted by reference numeral 117, and $n^-$-silicon is denoted by reference numeral 118.

The following text, referring to FIG. 2 to FIG. 7, describes a process for producing the dual gate field-effect transistor 100 shown in FIG. 1 in accordance with a first exemplary embodiment of the invention.

Figure 2:
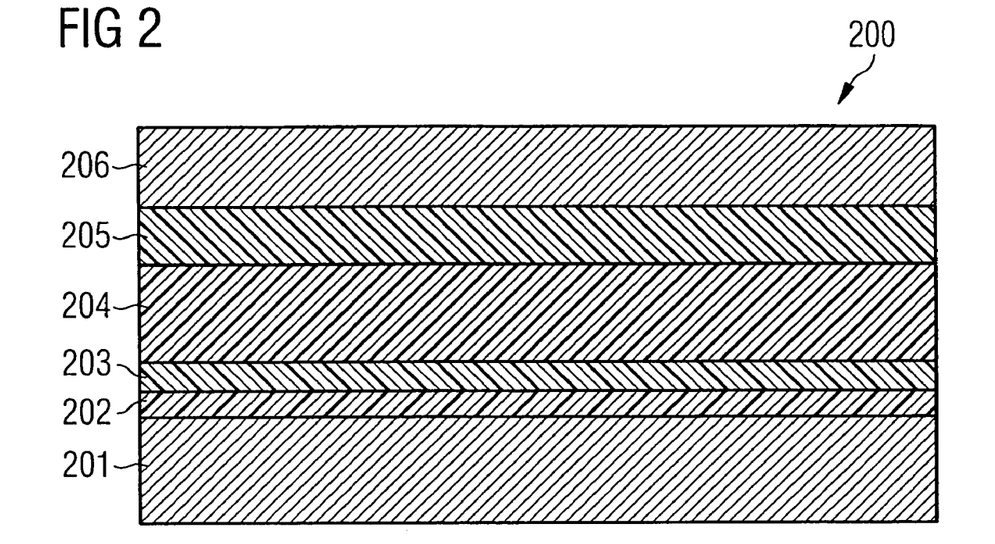
FIG. 2 shows a cross-sectional view through a layer sequence on section line A-A' from FIG. 1 at a first instant during a process for producing the dual gate field-effect transistor in accordance with the first exemplary embodiment of the invention.

To obtain the layer sequence 200 shown in FIG. 2, starting with a bulk silicon wafer 201, a $p^{++}$-silicon layer 202, which is used as an etch stop layer during a subsequent etchback of silicon material, is formed on the bulk silicon wafer 201. As an alternative to the $p^{++}$-silicon layer 202, it is also possible to grow a layer with a suitable germanium concentration of typically greater than 20%, which can serve a similar purpose to the $p^{++}$-silicon layer 202, i.e. as an etch stop layer.

Then, an $n^-$-silicon layer 203 is grown epitaxially on the $p^{++}$-silicon layer 202. The $n^-$-silicon layer 203 can be used as an etch stop layer when forming pores in the porous silicon material.

Then, a weakly doped single-crystal silicon layer (c-Si), not shown in FIG. 2, which forms a seed layer for the subsequent formation of a layer of porous silicon, is grown epitaxially.

Then, a porous silicon layer is formed in a controlled way in an anodizing solution. It is preferable for the porous silicon layer to be formed with a low porosity/high porosity profile, so that a good quality of the top silicon growth can be achieved. As a result, a high-porosity silicon layer 204 is formed over the $n^-$-silicon layer 203, and then a low-porosity silicon layer 205 is formed on the high-porosity silicon layer 204.

A single-crystal silicon layer 206 is grown epitaxially on the layer sequence obtained in this way. Details of this process can be realized using the ELTRAN-SOI process, so that it is possible to obtain a very good quality of the c-silicon layer 206 on a porous layer, such as the layer 204, 205, cf. "Silicon Wafer Bonding Technology for VLSI and MEMS applications".

Figure 3:
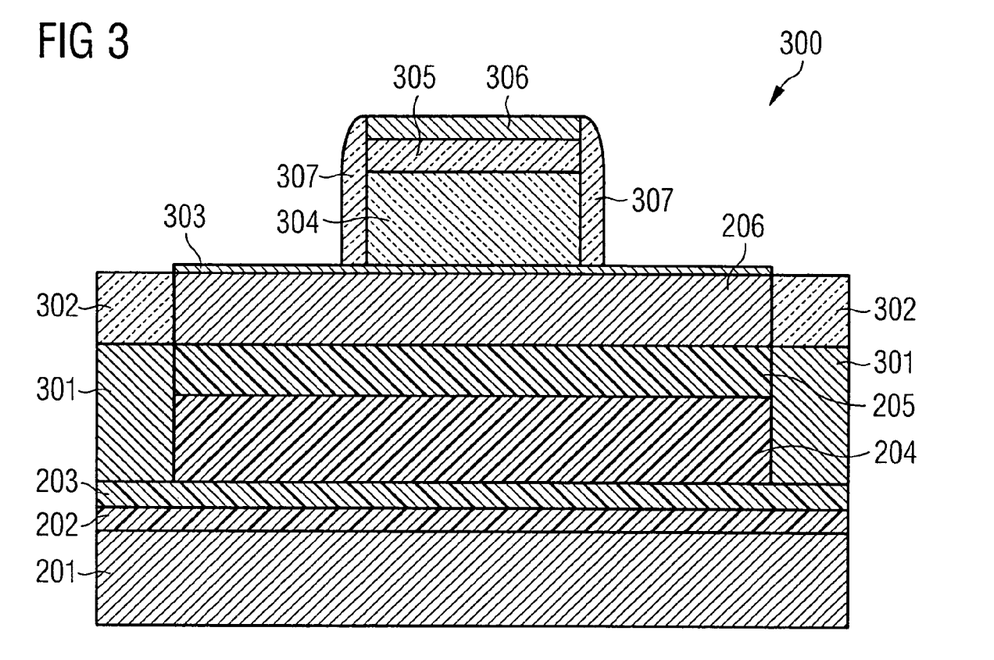
FIG. 3 shows a cross-sectional view through a layer sequence on a section line A-A' from FIG. 1 at a second instant during a process for producing the dual gate field-effect transistor in accordance with the first exemplary embodiment of the invention.

To obtain the layer sequence 300 shown in FIG. 3, first of all an active area of the dual gate SOI transistor 100 is defined by means of a first photolithography process (cf. active area 101 in FIG. 1). A first mask is used for this purpose. Then, material of the single-crystal silicon layer 206 and material of the porous layers 204, 205 are removed by means of a dry etching process using this mask, with the $n^-$-silicon layer 203 serving as an etch stop layer.

A selectivity of 20:1 or more between the etching of material of a porous silicon layer and of a single-crystal silicon layer can be achieved, cf. Tserepi, A, et al.

Then, silicon oxide material is deposited on the layer sequence obtained in this way and planarized by means of a CMP (chemical mechanical polishing) process, with the channel region, i.e. the patterned single-crystal silicon layer 206, serving as a stop layer.

Then, a dry etchback process is carried out, by means of which silicon oxide material is etched selectively with respect to silicon material. The result is the silicon oxide structure 301.

Then, silicon nitride material is deposited and planarized by means of a CMP process, with the channel region, i.e. the laterally patterned single-crystal silicon layer 206, serving as a stop layer. In this way, the silicon nitride structure 302 shown in FIG. 3 is obtained on the silicon oxide structure 301. The channel region can optionally be lightly oxidized prior to the CMP process step, resulting in the formation of a thin protective layer. The thickness of the silicon nitride layer 302 should be selected in such a way that it is approximately equal to the thickness of the single-crystal silicon layer 206.

The uncovered silicon material of the patterned single-crystal silicon layer 206 is then treated by means of thermal oxidation, resulting in the formation of a first gate-insulating layer 303 (bottom gate oxide).

Next, first of all, polysilicon material is deposited, then silicon nitride material is deposited thereon, and silicon oxide material is deposited on the silicon nitride material.

Next, a gate-defining region 102 is defined by means of a second photolithography process, i.e. using a second mask. First of all, the deposited silicon oxide layer, then the deposited silicon nitride layer and finally the deposited polysilicon layer, are laterally patterned by means of an etchback process using this mask, with the result that a laterally delimited layer sequence comprising a first gate electrode 304, a silicon nitride layer 305 formed thereon, and a silicon oxide layer 306 arranged on the silicon nitride layer 305, is obtained. The first gate-insulating layer 303 in this case serves as an etch stop layer.

Then, a layer of silicon nitride material is deposited conformally in order to produce gate spacers. An anisotropic gate spacer etching step is carried out, with the result that silicon nitride spacers 307 are obtained on side walls of the laterally patterned layers 304 to 306.

Figure 4:
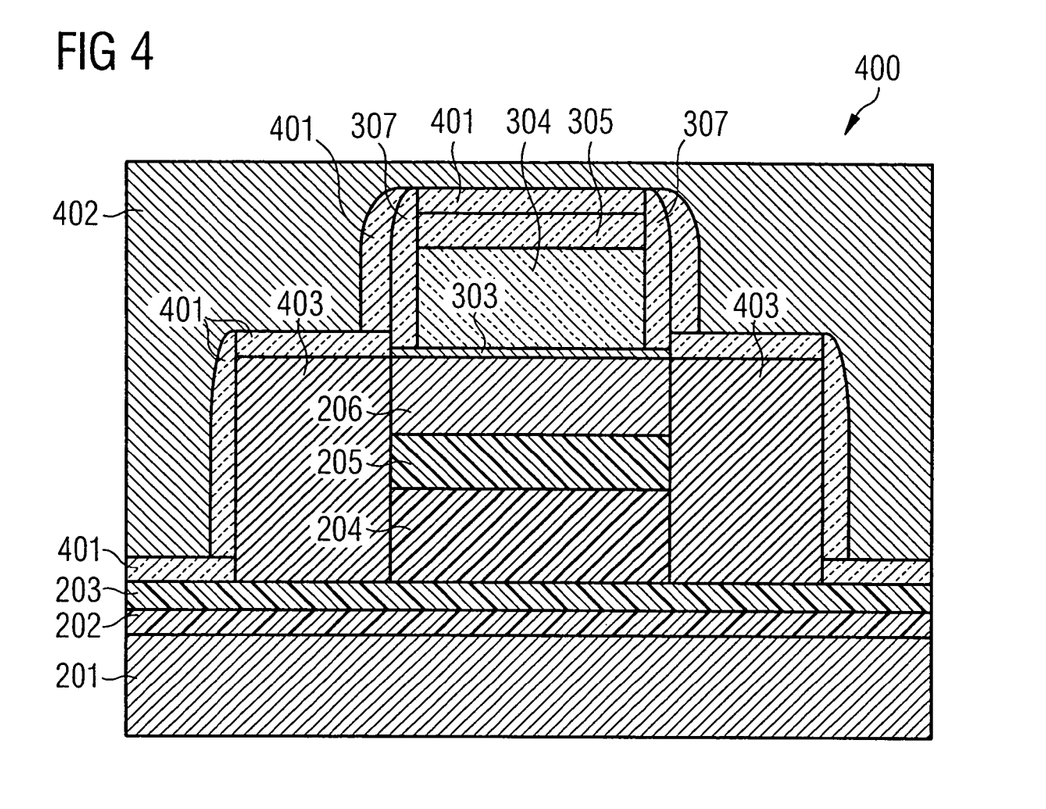
FIG. 4 shows a cross-sectional view through a layer sequence on a section line A-A' from FIG. 1 at a third instant during a process for producing the dual gate field-effect transistor in accordance with the first exemplary embodiment of the invention.

The text which follows describes, with reference to FIG. 4, a sequence of etching steps in which the gate stack and a silicon nitride insulation layer serve as a mask.

To obtain the layer sequence 400 shown in FIG. 4, first of all the uncovered regions of the first gate-insulating layer 303 are removed by means of etching (the thickness of the first gate-insulating layer 303 is typically a few nanometers). Then, an anisotropic etching process is used to etch silicon material selectively with respect to silicon nitride material and silicon oxide material, so that uncovered surface regions of the single-crystal silicon layer 206 are removed.

Next, an etching process is carried out, etching porous silicon (i.e. uncovered material of the layers 204, 205) selectively with respect to silicon nitride. In this case, the n$^-$-silicon layer 203 (or the p$^{++}$-silicon layer 202) is used as the etch stop layer (alternatively, it is also possible for a silicon-germanium layer to be used as the etch stop layer).

The porosity of the layers 204, 205 can lead to unevenness or roughness following this dry etching step. An optional baking step in a hydrogen environment or the optional addition of small quantities of vapor phase silicon at a high temperature could help to smooth the surface (cf. ELTRAN process). On the other hand, the subsequent further growth of silicon material may resolve this problem.

Then, crystalline silicon material or polysilicon material is grown on the surface of the n$^-$-silicon layer 203. The grown silicon material is shown as crystalline silicon structure 403 in FIG. 4.

Then, an anisotropic etching process is carried out to etch silicon nitride material and silicon oxide material. A good anisotropy of the etching process is advantageous in this context. The top silicon oxide layer 306 above the gate line 304 serves as protection during the silicon nitride etch and is only removed during the subsequent silicon oxide etch. The silicon nitride layer 305 remains on the first gate electrode 304.

Then, silicon nitride material is deposited conformally, resulting in the formation of a silicon nitride capping layer 401.

This silicon nitride capping layer 401 fulfills a number of objectives, firstly that of protecting the self-alignment of the gate regions and secondly of electrical insulation. The silicon nitride capping layer 401 also compensates for possible damage in the bottom gate spacers 307 which may result from a prior dry etching step.

Then, a thick silicon oxide layer is deposited and planarized by means of a CMP process, resulting in the production of a silicon oxide capping layer 402.

Figure 5:
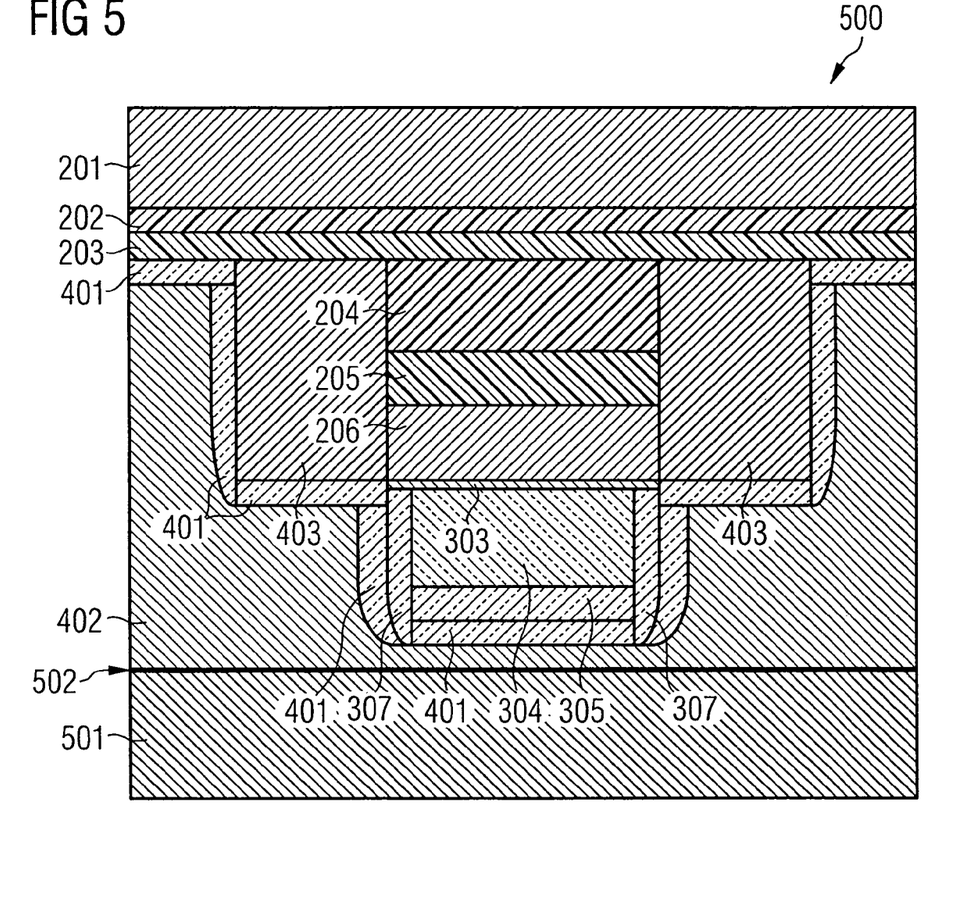
FIG. 5 shows a cross-sectional view through a layer sequence on a section line A-A' from FIG. 1 at a fourth instant during a process for producing the dual gate field-effect transistor in accordance with the first exemplary embodiment of the invention.

To obtain the layer sequence 500 shown in FIG. 5, first of all the layer sequence 400 is prepared for a subsequent wafer bonding step. Furthermore, a handle wafer 501, the surface region of which includes silicon oxide material, is prepared for a subsequent bonding process. This preparation may involve chemical activation or plasma activation of the surfaces of the wafers 400, 501 which are to be bonded. Then, the handle wafer 501 is secured to the planar silicon oxide capping layer 402 at a bonding interface 502 by means of wafer bonding, and the layer structure obtained is subjected to a heat treatment in order to strengthen the adhesion of the bonded regions to one another.

Clearly, the upper surface of the layer sequence 400 as shown in FIG. 4 is brought into contact with a surface of the handle wafer 501 at the bonding interface 502 and joined to it by means of wafer bonding.

Figure 6:
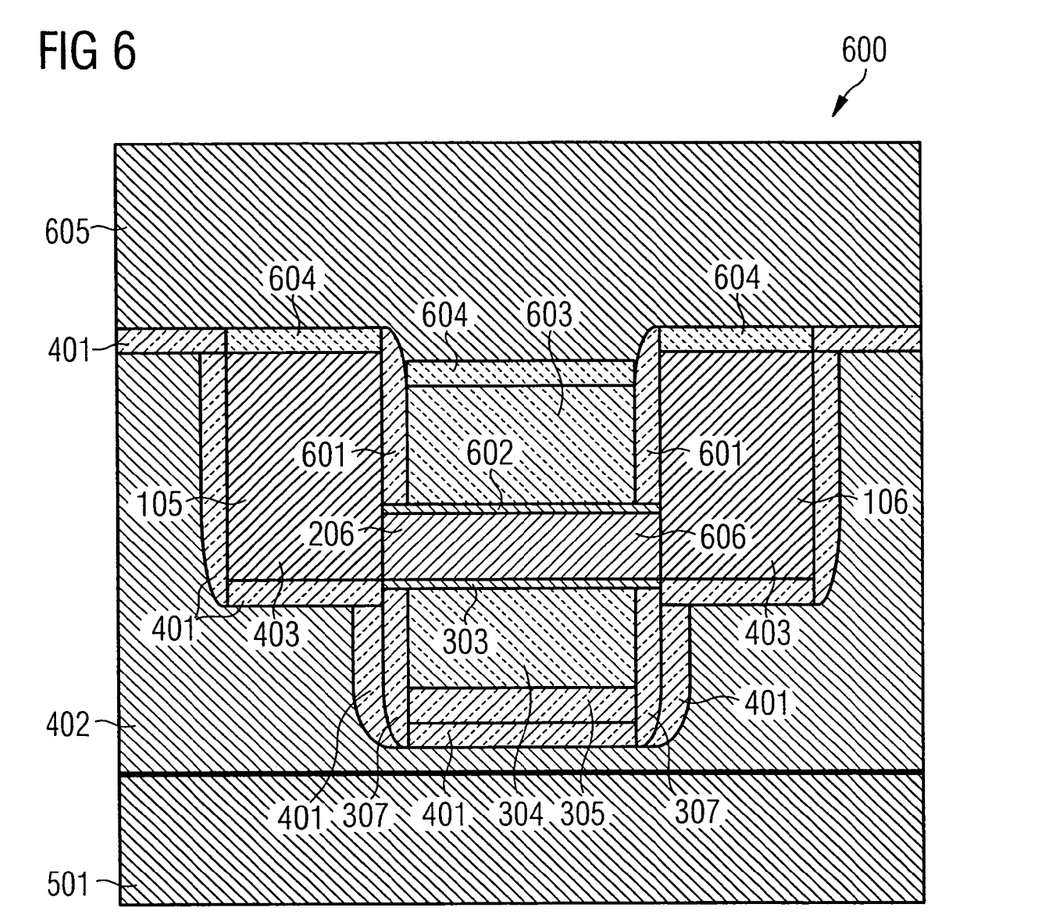
FIG. 6 shows a cross-sectional view through the dual gate field-effect transistor in accordance with the first exemplary embodiment of the invention on a section line A-A' from FIG. 1.

To obtain the dual gate field-effect transistor 600 shown in FIG. 6, first of all material is removed from the top side of the layer sequence 500, namely the bulk silicon wafer 201, the p$^{++}$-silicon layer 202 and the n$^-$-silicon layer 203. The removal of top wafer material can be effected by grinding away material or by means of the smart-cut process etc., and then by means of selective etchback of residual silicon in an alkaline solution, such as for example EDP, KOH, TMAH or Choline. Here, the p$^{++}$-doped layer 202 serves as an etch stop layer. Then, the p$^{++}$-doped silicon layer 202 and the n$^-$-silicon layer 203 are removed, a CMP process is carried out or oxidation and wet-etching of silicon oxide are carried out.

Then, the porous silicon 204, 205, i.e. the high-porosity silicon layer 204 and the low-porosity silicon layer 205, are removed by means of a selective etching process. A selectivity of 100000 between the etching of porous silicon material (i.e. of the layers 205, 204), on the one hand, and the etching of crystalline silicon (i.e. of the components 403, 206), on the other hand, can be achieved using an HF/H$_2$O$_2$/H$_2$O mixture. Consequently, there is no degradation of the non porous silicon 206, 403 lying beneath the porous layers 204, 205. Uncovered silicon oxide material can also be removed during this selective etching step. The etching of the porous silicon defines the self-alignment of the two gate regions. Since the etching process described is selective with respect to silicon nitride material, the side walls of the trench which is formed will assist with the self-alignment without the need for an additional photolithography step (cf. also cross-sectional view through the gates in FIG. 7).

Then, a heating treatment in a hydrogen environment is carried out in order to remove microroughness at the silicon surface. This can also be done by means of a sacrificial oxidation step and by removal of the silicon oxide.

Then, silicon nitride material is deposited and an anisotropic gate spacer etch is carried out for the purpose of forming additional silicon nitride spacers 601 at side walls of the trench.

Then, an uncovered surface region of the single-crystal silicon layer 206 is thermally oxidized, so that a top silicon oxide layer, namely a second gate-insulating layer 602, is formed. In this process step, the uncovered surfaces of the crystalline silicon structure 403, which are subsequently used as source/drain regions of the dual gate field-effect transistor 600, are also oxidized and thereby provided with a thin silicon oxide layer. This thin silicon oxide layer on the subsequent source/drain regions can advantageously be used to avoid "channeling" effects, i.e. to avoid undesirably deep penetration of doping material during a subsequent implantation step, which doping material is scattered over the silicon oxide surface layer.

After the second gate-insulating layer 602 has been formed, polysilicon material is deposited (and optionally doped in situ), and the layer sequence obtained in this way is subjected to a CMP process step. In the CMP process, the silicon nitride surface layer 401 serves as a stop layer. A certain quantity of the polysilicon material is then etched back in order to avoid short circuits between the second gate electrode 603 formed in this way and the subsequent source/drain regions 403. In other words, polysilicon material is removed to such an extent that a small trench is formed.

This is followed by an implantation step for implanting doping material into the two regions of the crystalline silicon structure 403, which in accordance with FIG. 6 are adjacent to the single-crystal silicon layer 206 as channel region on the left-hand and right-hand sides, resulting in the formation of source/drain regions 403.

Then, the silicon oxide material which may have been formed on the uncovered surface regions of the crystalline silicon structure 403 during the formation of the second gate-insulating layer 602 is removed. Then, a metallic material (e.g. cobalt) is deposited, resulting in a self-aligned silicide (a silicon-cobalt compound) being formed on the source/drain regions 403 and on the second gate electrode 603. These silicide terminals are denoted by reference numeral 604. Finally, a thick silicon oxide layer is deposited on the layer sequence obtained in this way and planarized by means of a CMP process, resulting in the formation of a silicon oxide capping layer 605.

The text which follows, referring to FIG. 7, describes a layer sequence 700 which is taken on a sectional view B-B' from FIG. 1 and which shows the contact-connections for electrically driving the first gate electrode 304 and the second gate electrode 603.

First of all, a contact region of the bottom gate electrode 304 is defined using a third photolithography step, for which purpose a third mask is used (cf. FIG. 1). The silicon oxide material of the silicon oxide capping layer 605 is subjected to an anisotropic etching process, with the silicon terminals 604 forming an etching stop layer. Then, the silicide material 604 is subjected to an anisotropic etching process, with polycrystalline silicon material being used as the stop layer. Then, the polycrystalline silicon is subjected to an anisotropic etching process, with silicon nitride material being used as stop layer. Then, photoresist is removed from the surface of the layer sequence obtained in this way.

The silicide layer 604 and the top gate polysilicon layer 603 are laterally subjected to a controlled thermal oxidation, resulting in an electrical insulation between top gate electrode 603 and bottom gate electrode 304.

Then, an anisotropic etch of silicon nitride material is carried out, with polysilicon material 304 being used as stop layer. Metal material is introduced into the trenches formed, with the result that contacts 701 are formed. A metal-semiconductor junction is formed in the boundary region between the contact 701 for contact-connection of the top gate electrode 603 and the silicide terminal 604.

The additional contact hole-defining regions 104 shown in FIG. 1 are formed using a fourth photolithography mask. Then, a back-end process can be carried out.

As an alternative to FIG. 7, as shown in the layer sequence 800 illustrated in FIG. 8, the third photolithography mask can be designed in such a manner that coupling to the top gate electrode 603 and to the bottom gate electrode 304 is realized by means of just one via contact 801 and by means of silicide contact-connection elements 802, in which case both electrodes 304, 603 are actuated using a common gate voltage, producing a configuration which is particularly simple in terms of its circuitry.

Figure 9:
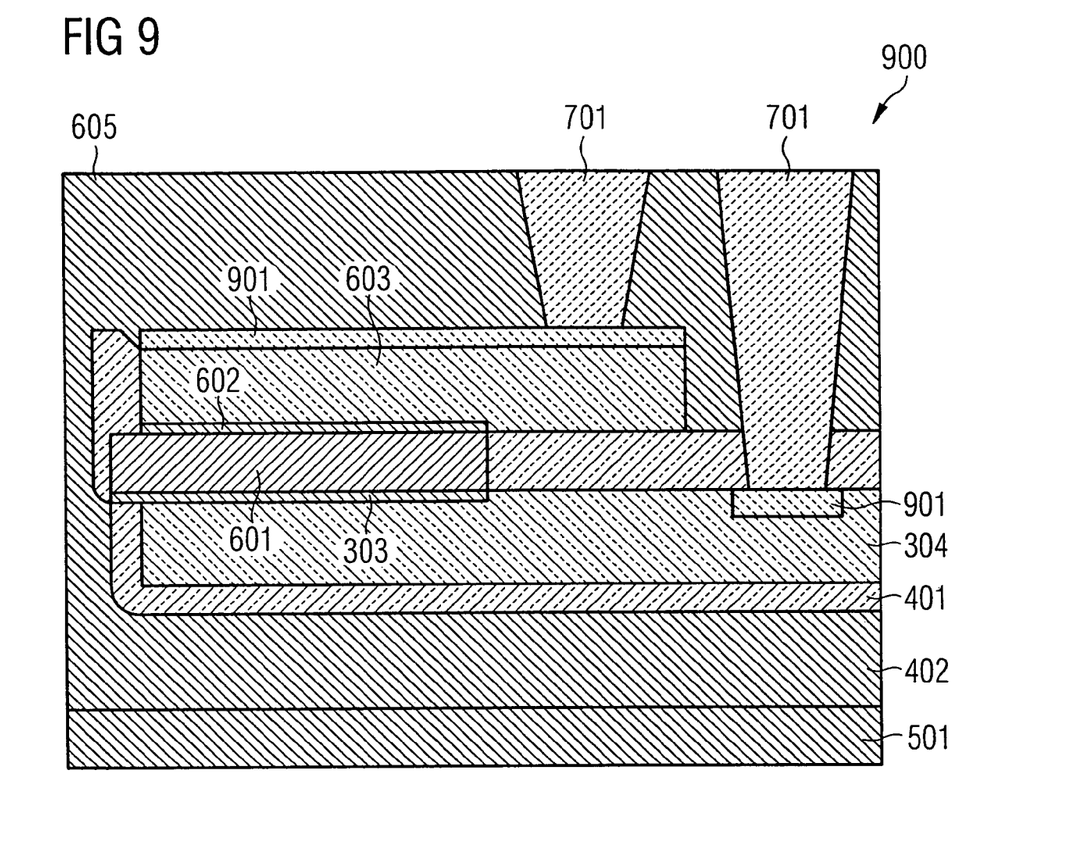
FIG. 9 shows a cross-sectional view through a dual gate field-effect transistor in accordance with a third exemplary embodiment of the invention on a section line B-B' from FIG. 1.

The following text, referring to FIG. 9, describes a layer sequence 900 which, like FIG. 7, is taken on a section line B-B' from FIG. 1.

The layer sequence 900 illustrates a structure as obtained in accordance with an alternative process for forming siliciding to that shown in FIG. 7, FIG. 8. The layer sequence 900 differs from the layer sequence 700 substantially by virtue of the fact that the bottom electrode 304, the top electrode 603 and the two source/drain regions 105, 106 (not shown in FIG. 9) are provided with common silicide contact-connection elements 901, which are formed in a common process step.

To form a dual gate field-effect transistor corresponding to the layer sequence 900, the processing needs to be modified with respect to the processing described with reference to FIG. 2 to FIG. 6, as described below. The processing is identical to the processing described with reference to FIG. 2 to FIG. 5. After silicon oxide material which may have been formed on the uncovered surface regions of the crystalline silicon structure 403 when forming the second gate-insulating layer 602 has been removed, as a deviation from the processing shown in FIG. 6, according to the alternative described here a metallic material (e.g. cobalt) is not deposited immediately. Instead, the formation of the siliciding is carried out in a subsequent process step and the formation of the silicon oxide capping layer 605 is likewise only carried out at a later stage. According to the alternative described, the third photolithography step for forming a contact region of the bottom gate electrode 304 is carried out immediately after the completion of the top gate electrode 603. After a contact hole for contact-connection of the bottom electrode 603 has been produced in this way, the entire uncovered surface of the top gate electrode 603, the surface region of the bottom gate electrode 304 uncovered by means of the contact hole and the uncovered source/drain regions 105, 106 are silicided in a common process step. This processing is particularly economical since a plurality of silicide contact-connection elements 901 are formed in one common process step. Then, a silicon oxide capping layer 605 is formed, and ultimately the layer sequence 900 is obtained. In the cross-sectional view A-A' in accordance FIG. 1, this results in a dual gate field-effect transistor in accordance with FIG. 6.

The invention claimed is:

1. A process for producing a layer arrangement, comprising the steps of:
   forming a porous silicon layer as a sacrificial layer on an auxiliary substrate;
   forming a first semiconductor layer on the sacrificial layer;
   forming a first electrically insulating layer on the first semiconductor layer;
   forming an electrically conductive layer on the first electrically insulating layer, wherein the electrically conductive layer is laterally patterned;
   wherein the first electrically insulating layer, the sacrificial layer, and the first semiconductor layer are jointly patterned laterally using the laterally patterned electrically conductive layer as a mask;

forming a semiconductor structure adjacent to side walls of the patterned sacrificial layer and of the patterned first semiconductor layer;

securing a substrate over the patterned electrically conductive layer;

removing material of the auxiliary substrate, so that the sacrificial layer is uncovered;

selectively removing the sacrificial layer, so as to form a trench; and forming a second electrically insulating layer in the trench, and forming an electrically conductive structure on this second electrically insulating layer.

2. The process as claimed in claim 1, wherein the auxiliary substrate is a bulk semiconductor substrate.

3. The process as claimed in claim 1, wherein the auxiliary substrate is a bulk silicon substrate.

4. The process as claimed in claim 1, wherein the porous silicon layer is a silicon layer of a first porosity and a silicon layer of a second porosity arranged thereon, the first porosity being greater than the second porosity.

5. The process as claimed in claim 1, wherein the first semiconductor layer is a single-crystal silicon layer.

6. The process as claimed in claim 1, wherein the electrically conductive layer is a polycrystalline silicon layer.

7. The process as claimed in claim 1, wherein the semiconductor structure is single-crystal silicon material.

8. The process as claimed in claim 1, wherein the selective removal of the sacrificial layer is realized by means of an etching process, by means of which material of the sacrificial layer is removed selectively with respect to material of the semiconductor structure.

9. The process as claimed in claim 1, wherein the material of the electrically conductive structure is polycrystalline silicon.

10. The process as claimed in claim 1, further comprising the step of forming a second semiconductor layer between the auxiliary substrate and the sacrificial layer.

11. The process as claimed in claim 10, wherein the second semiconductor layer is a p-doped silicon layer and an n-doped silicon layer arranged thereon.

12. The process as claimed in claim 11, wherein the dopant concentration of the p-doped silicon layer is greater than the dopant concentration of the n-doped silicon layer.

13. The process as claimed in claim 12, wherein the second semiconductor layer is a germanium-silicon layer and an n-doped silicon layer arranged thereon.

14. The process as claimed in claim 1, wherein prior to the step of securing the substrate, further comprising the step of forming an electrically insulating structure with a planar surface on the layer sequence derived from the processed auxiliary substrate.

15. The process as claimed in claim 1, wherein the substrate is secured by means of bonding.

16. The process as claimed in claim 1, further comprising the step of applying a metallic material to the semiconductor structure and/or to the electrically conductive structure and/or to the laterally patterned electrically conductive layer.

17. The process as claimed in claim 1, wherein the layer arrangement is designed as a dual gate field-effect transistor.

18. The process as claimed in claim 17, wherein the first semiconductor layer is a channel region, the semiconductor structure is source/drain regions, the electrically conductive layer is a first gate electrode, the first electrically insulating layer is a first gate-insulating layer, the electrically conductive structure is a second gate electrode, and the second electrically insulating layer is a second gate-insulating layer.

* * * * *

UNITED STATES PATENT AND TRADEMARK OFFICE
CERTIFICATE OF CORRECTION

| | |
|---|---|
| PATENT NO. | : 7,312,126 B2 |
| APPLICATION NO. | : 11/178251 |
| DATED | : December 25, 2007 |
| INVENTOR(S) | : Gurkan Ilicali et al. |

It is certified that error appears in the above-identified patent and that said Letters Patent is hereby corrected as shown below:

In Other Publications:

On the face of the patent, Item [56] second column, line 3, "Tserept, A., et al.;" should read --Tserepi, A., et al.;--

In the Abstract:

On the face of the patent, Item [57] replace the Abstract with the Abstract filed on 10/14/2005. The Abstract should read as follows:

--A process for producing a layer arrangement, which layer arrangement allows a dual gate field-effect transistor to be formed. In this process, a porous silicon layer is formed as sacrificial layer on an auxiliary substrate. A first semiconductor layer is formed on the sacrificial layer, and a first electrically insulating layer is formed on the first semiconductor layer. An electrically conductive layer is formed on the first electrically insulating layer, which electrically conductive layer is laterally patterned. The first electrically insulating layer, the sacrificial layer and the first semiconductor layer are jointly laterally patterned using the laterally patterned electrically conductive layer as a mask. Furthermore, a semiconductor structure is formed adjacent to side walls of the patterned sacrificial layer and of the patterned first semiconductor layer. A substrate is secured over the patterned electrically conductive layer, and material of the auxiliary substrate is removed, so that the sacrificial layer is uncovered. Furthermore, the sacrificial layer is selectively removed, so as to form a

UNITED STATES PATENT AND TRADEMARK OFFICE
CERTIFICATE OF CORRECTION

PATENT NO. : 7,312,126 B2
APPLICATION NO. : 11/178251
DATED : December 25, 2007
INVENTOR(S) : Gurkan Ilicali et al.

It is certified that error appears in the above-identified patent and that said Letters Patent is hereby corrected as shown below:

trench, and a second electrically insulating layer is formed in the trench, then an electrically conductive structure is formed on this second electrically insulating layer.--

Signed and Sealed this

Nineteenth Day of August, 2008

JON W. DUDAS
*Director of the United States Patent and Trademark Office*